US012660272B2

(12) United States Patent
Kavrik et al.

(10) Patent No.: US 12,660,272 B2
(45) Date of Patent: Jun. 16, 2026

(54) SELECTIVE GATE OXIDE FORMATION ON 2D MATERIAL BASED TRANSISTOR DEVICES

(71) Applicant: Intel Corporation, Santa Clara, CA (US)

(72) Inventors: Mahmut Sami Kavrik, Eugene, OR (US); Carl Naylor, Portland, OR (US); Chelsey Dorow, Portland, OR (US); Chia-Ching Lin, Portland, OR (US); Dominique Adams, Portland, OR (US); Kevin O'Brien, Portland, OR (US); Matthew Metz, Portland, OR (US); Scott Clendenning, Portland, OR (US); Sudarat Lee, Hillsboro, OR (US); Tristan Tronic, Aloha, OR (US); Uygar Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/091,197

(22) Filed: Dec. 29, 2022

(65) Prior Publication Data

US 2024/0222441 A1 Jul. 4, 2024

(51) Int. Cl.
*H01L 29/40* (2006.01)
*H01L 21/28* (2025.01)
(Continued)

(52) U.S. Cl.
CPC ........... *H10D 64/01* (2025.01); *H10D 30/673* (2025.01); *H10D 30/6734* (2025.01);
(Continued)

(58) Field of Classification Search
CPC ........... H10D 30/6737; H10D 30/6739; H10D 30/673; H10D 30/6734; H10D 30/6736; H10D 30/014; H10D 30/40; H10D 30/47; H10D 30/017; H10D 30/481; H10D 30/67; H10D 30/6757; H10D 30/663; H10D 30/0415; H10D 30/026; H10D 30/019; H10D 30/021; H10D 30/0198;
(Continued)

(56) References Cited

U.S. PATENT DOCUMENTS

| | | | | |
|---|---|---|---|---|
| 2012/0119261 A1* | 5/2012 | Umeda | ................ | H10D 30/475 |
| | | | | 257/E29.246 |
| 2019/0267467 A1* | 8/2019 | Yoshimochi | ......... | H10D 30/015 |
| 2020/0388685 A1* | 12/2020 | Sharma | ................. | H10D 62/83 |

FOREIGN PATENT DOCUMENTS

| | | | | | |
|---|---|---|---|---|---|
| CN | 103295912 A | * | 9/2013 | ............ | H10P 50/692 |
| CN | 108198824 B | * | 6/2020 | ......... | H10D 30/6723 |

(Continued)

*Primary Examiner* — Lawrence C Tynes, Jr.
(74) *Attorney, Agent, or Firm* — Essential Patents Group, LLP

(57) ABSTRACT

Devices, transistor structures, systems, and techniques, are described herein related to selective gate oxide formation on 2D materials for transistor devices. A transistor structure includes a gate dielectric structure on a 2D semiconductor material layer, and source and drain structures in contact with the gate dielectric structure and on the 2D semiconductor material layer. The source and drain structures include a metal material or metal nitride material and the gate dielectric structure includes an oxide of the metal material or metal nitride material.

21 Claims, 9 Drawing Sheets

(51) Int. Cl.

| | |
|---|---|
| *H01L 21/3213* | (2006.01) |
| *H10D 30/67* | (2025.01) |
| *H10D 64/01* | (2025.01) |
| *H10D 64/62* | (2025.01) |
| *H10P 50/26* | (2026.01) |
| *H10D 62/80* | (2025.01) |
| *H10D 62/85* | (2025.01) |

(52) U.S. Cl.
CPC ....... *H10D 30/6737* (2025.01); *H10D 30/675* (2025.01); *H10D 64/011* (2026.01); *H10D 64/0114* (2026.01); *H10D 64/01358* (2026.01); *H10D 64/01364* (2026.01); *H10D 64/62* (2025.01); *H10P 50/267* (2026.01); *H10D 30/6736* (2025.01); *H10D 30/6739* (2025.01); *H10D 62/80* (2025.01); *H10D 62/8503* (2025.01); *H10D 62/882* (2025.01)

(58) Field of Classification Search
CPC .... H10D 30/603; H10D 30/478; H10D 30/00; H10D 30/01; H10D 30/015; H10D 30/801; H10D 64/011; H10D 64/0114; H10D 64/01364; H10D 64/691; H10D 64/689; H10D 64/251; H10D 64/257; H10D 64/259; H10D 64/2565; H10D 64/256; H10D 64/605; H10D 64/62; H10D 64/66; H10D 64/666; H10D 64/033; H10D 64/602; H10D 62/149; H10D 62/82; H10D 62/882; H10D 62/883; H10D 62/881; H10D 62/156; H10D 84/017; H10D 84/0186; H10D 84/0165; H10D 84/0167; H10D 84/0172; H10D 84/0181; H10P 14/6314; H10P 14/6319

See application file for complete search history.

(56) References Cited

FOREIGN PATENT DOCUMENTS

| | | | | | |
|---|---|---|---|---|---|
| JP | 2002094040 | A | * | 3/2002 | |
| TW | 1445085 | B | * | 7/2014 | ......... H01L 21/0485 |
| TW | 1619257 | B | * | 3/2018 | ............. H10P 50/00 |
| TW | 1626746 | B | * | 6/2018 | ......... H10D 62/8325 |

\* cited by examiner

200

204

207

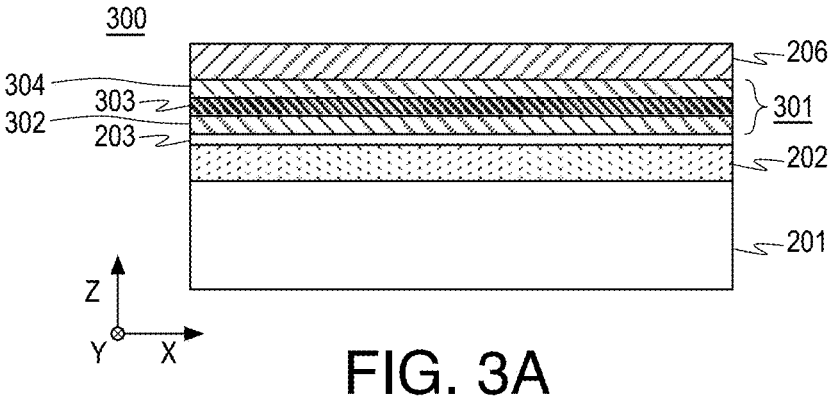
FIG. 3A
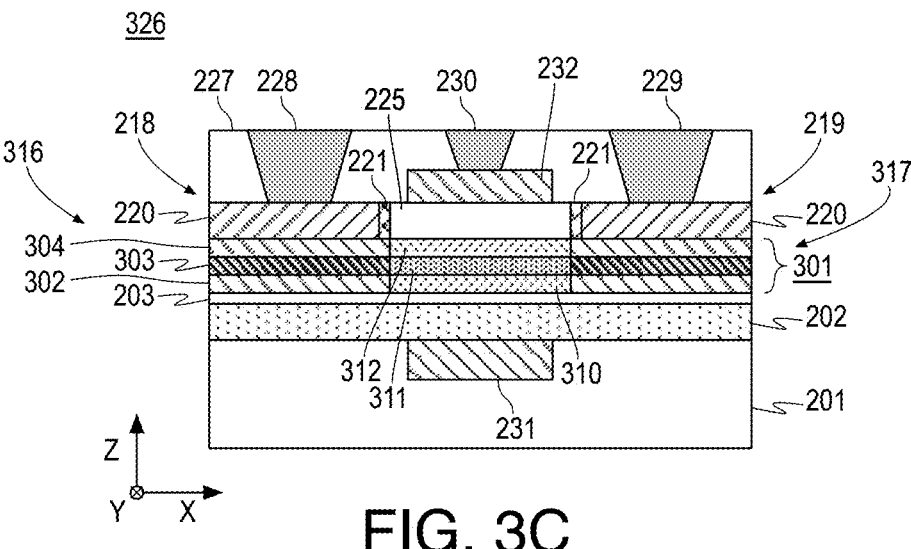
FIG. 3B
FIG. 3C

SELECTIVE GATE OXIDE FORMATION ON 2D MATERIAL BASED TRANSISTOR DEVICES

BACKGROUND

In transistor applications, 2D materials are promising for deployment as the semiconductor in field effect transistors (FETs) and ferroelectric field effect transistors (FeFETs). For example, at 2-3 nm gate lengths, 2D materials may be needed to continue shrinking transistors for ever more advanced electronic devices. However, use of 2D materials in transistor devices faces numerous challenges. One major challenge for implementation of 2D material in FET/FeFET devices is the need for damage free, defect free gate oxide formation on the 2D materials. Currently, gate oxides may be grown by atomic layer deposition that utilize highly reactive precursors that can induce damage on the 2D materials. Moreover, the absence of dangling bonds on 2D surfaces introduce challenges to the oxide nucleation on the surface of the 2D materials and necessitates surface activation by plasma processes or utilizing highly reactive metal precursors. Furthermore, due to high contact resistance between 2D materials and source and drain (S/D) metals, a gate first process flow cannot be adopted, leading to S/D lithographic patterning that exposes both S/D regions and the channel region to photoresist. The lithography processing induces sub-nm residual carbon on the 2D material, which, due to the sensitivity of 2D materials to oxygen, plasma, UV light, and thermal budget in transistor fabrication, can result in an undesirable interlayer between the 2D materials and the gate oxide. The interlayer deteriorates device performance by inducing charge traps that result in Vt shift, hysteresis, pinning of the fermi level, and other undesirable characteristics.

It is with respect to these and other considerations that the present improvements have been needed. Such improvements may become critical as the desire to deploy 2D materials in transistor devices becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 3A, 3B, and 3C are cross-sectional views of a 2D channel material-based transistor structure employing a Ru based material system and a multilayer gate dielectric stack evolving as the methods of FIG. 1 are practiced;

DETAILED DESCRIPTION

Figure 1:
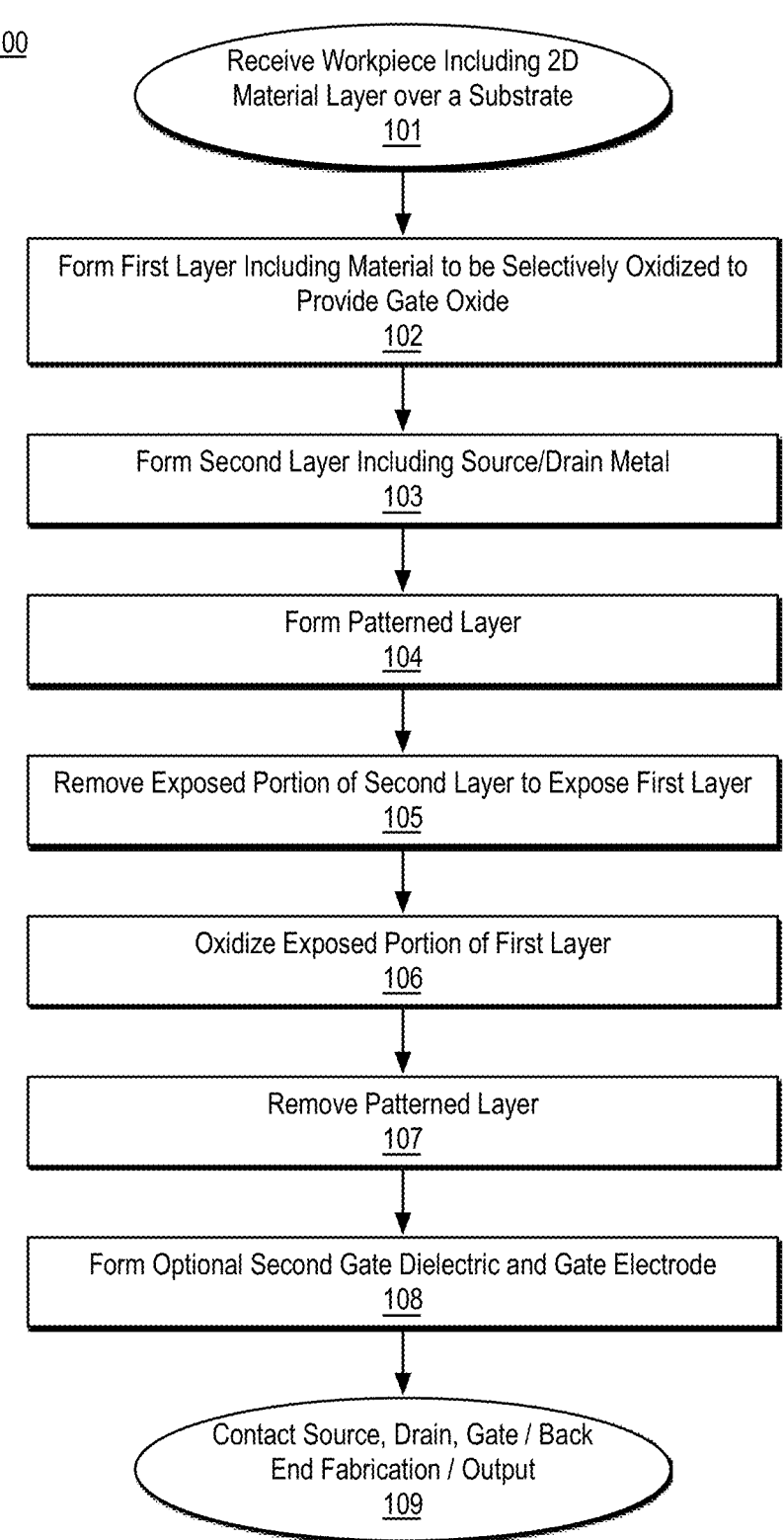
FIG. 1 is a flow diagram illustrating methods for forming a transistor structure having a 2D semiconductor layer and a selective gate dielectric formed by oxidation of a metal layer.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. Herein, the term "predominantly" indicates not less than 50% of a particular material or component while the term "substantially pure" indicates not less than 99% of the particular material or component and the term "pure" indicates not less than 99.9% of the particular material or component. Unless otherwise indicated, such material percentages are based on atomic percentage. Herein the term concentration is used interchangeably with material percentage and also indicates atomic percentage unless otherwise indicated.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. As used herein, the terms "monolithic", "monolithically integrated", and similar terms indicate the components of the monolithic overall structure form an indivisible whole not reasonably capable of being separated.

Device structures, transistor structures, apparatuses, systems, and techniques are described herein related to 2D material-based transistors having improved contact resistance and a high-quality gate oxide with minimal or no damage to the channel 2D material.

As discussed, in the context of 2D material-based field effect transistors (FETs) and ferroelectric field effect transistors (FeFETs), there is a need for improved formation of gate oxide (or, generally, gate dielectric) on the 2D material channel of the FET/FeFET. In some embodiments, a gate oxide is formed by selectively applying an oxygen plasma and/or ozone/water/hydrogen peroxide treatment or any oxidation source such as a wet etch treatment to a layer that is on or over the 2D material. In some embodiments, the layer is a metal layer that is to be oxidized to form the gate oxide. The oxygen plasma is selectively applied to the metal layer only over the channel region while other portions of the metal layer are protected by a patterned second metal layer. In some material systems the second metal layer is patterned using oxygen plasma processing that is in turned used to oxidize the metal layer. In other material systems, the second metal layer is first patterned using etch processing and oxygen plasma is then used to oxidize the metal layer.

Such processing advantageously forms the gate oxide by oxidizing a layer already formed on the 2D material layer. The remaining portion of the layer (i.e., the obscured portion that is not oxidized) remains metal and is part of the source/drain of the transistor structure. Such processing provides improved contact resistance (via the metal layer formed on the 2D material outside of the channel), forms a high-quality gate oxide (via selective oxygen plasma processing of the metal layer to form the gate oxide), and maintains a pristine 2D material. For example, no photoresist is formed on the 2D material (instead a mask is patterned on the second metal layer) and the 2D material is not damaged during formation of a metal oxide layer on a bare 2D material. These and other advantages will be evident based on the discussed embodiments.

The FETs/FeFETs discussed herein may be implemented in either or both of a front end of line or in a back end of line with particularly advantageous embodiments having the FETs/FeFETs deployed in the back end of line. As used herein, the term front end of line indicates the FETs/FeFETs are immediately adjacent a substrate with metal interconnects overlying the FETs/FeFETs. The term back end of line indicates the FETs/FeFETs are over other devices such as transistor devices and optionally over one or more of the interconnect layers that interconnect the underlying transistor devices. In some embodiments, silicon based transistors are formed immediately adjacent a substrate and are interconnected by metal interconnects and the FETs/FeFETs discussed herein are implemented over the transistors and over and/or within the metal interconnects.

FIG. 1 is a flow diagram illustrating methods 100 for forming a transistor structure having a 2D semiconductor layer and a selective gate dielectric formed by oxidation of a metal layer, arranged in accordance with some embodiments of the disclosure. Methods 100 may be practiced, for example, to fabricate any transistor structure discussed herein. FIGS. 2A, 2B, 2C, 2D, 2E, 2F, and 2G are cross-sectional views of a 2D channel material-based transistor structure employing a ruthenium (Ru) based material system evolving as methods 100 are practiced, arranged in accordance with some embodiments of the disclosure. FIGS. 3A, 3B, and 3C are cross-sectional views of a 2D channel material-based transistor structure employing a Ru based material system and a multilayer gate dielectric stack evolving as methods 100 are practiced, arranged in accordance with some embodiments of the disclosure. FIGS. 4A, 4B, 4C, 4D, and 4E are cross-sectional views of a 2D channel material-based transistor structure employing a metal nitride-based material system evolving as methods 100 are practiced, arranged in accordance with some embodiments of the disclosure.

Methods 100 begin at input operation 101, where a workpiece including a semiconductor layer including 2D material is received for processing. As used herein, the term 2D material indicates a crystalline solid material having one, two, or three layers of atoms, with a single layer of atoms being particularly advantageous. The 2D material may be formed over the substrate using any suitable technique or techniques including epitaxial growth techniques, epitaxial growth techniques followed by layer transfer, or the like. In some embodiments, the 2D material may be implemented in any suitable transistor type and architecture. In some embodiments, the 2D material is implemented in a FET. In some embodiments, the 2D material is implemented in a FeFET. The FET or FeFET may be a planar device, a gate all around device, a nanoribbon device, or the like. In some embodiments, the FET or FeFET includes a back side gate and a back side gate dielectric or ferroelectric material between the back side gate and the 2D material.

Figure 2A:
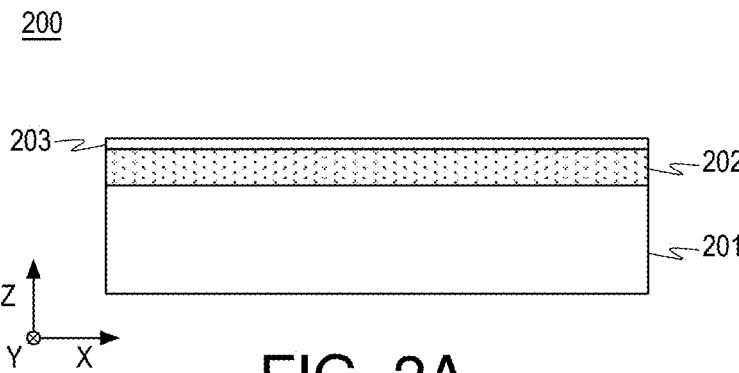
FIGS. 2A, 2B, 2C, 2D, 2E, 2F, and 2G are cross-sectional views of a 2D channel material-based transistor structure employing a ruthenium (Ru) based material system evolving as the methods of FIG. 1 are practiced.

FIG. 2A illustrates a cross-sectional side view of a 2D channel material-based transistor structure 200. As shown, 2D channel material-based transistor structure 200 includes a substrate 201, a gate dielectric or ferroelectric material layer 202 on or over substrate 201, and a 2D material layer 203 on or over gate dielectric or ferroelectric material layer 202.

Substrate 201 may include any suitable material or materials. For example, substrate 201 may be a substrate substantially aligned along a predetermined crystal orientation (e.g., <100>, <111>, <110>, or the like). In some embodiments, substrate 201 is a semiconductor material such as monocrystalline silicon (Si), germanium (Ge), silicon germanium (SiGe), a III-V materials-based material (e.g., gallium arsenide (GaAs)), a silicon carbide (SiC), a sapphire ($Al_2O_3$), or any combination thereof. In some embodiments, substrate 201 is silicon having a <111> crystal orientation. In various embodiments, substrate 201 may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like. In some embodiments, the FETs/FeFETs described herein are implemented in a back end of line. For example, silicon (or other material) based transistors may be formed immediately on and/or within substrate 201. The transistors may be interconnected by metallization features and the 2D channel material-based transistor structures discussed herein may be formed over or within the interconnected metallization features.

Gate dielectric or ferroelectric material layer 202 may include a gate dielectric material (i.e., in FET applications) or a ferroelectric material (i.e., in FeFET applications). In FET contexts, the gate dielectric material may have a high relative permittivity (i.e., dielectric constant, K). In some high-K gate dielectric embodiments, the gate dielectric material is a metal oxide including oxygen and one or more metals, such as, but not limited to, aluminum, hafnium, zirconium, tantalum, silicon, or titanium. In FeFET contexts, the ferroelectric material may be any hafnium oxide-based ferroelectrics such as hafnium zirconium oxide. The FeFET provides a single transistor non-volatile memory due to permanent electrical field polarization in the ferroelectric material causing the FeFET to retain a state (on or off) in the absence of any electrical bias.

As shown, in some embodiments, 2D material layer 203 is on or over gate dielectric or ferroelectric material layer 202. In some embodiments, gate dielectric or ferroelectric material layer 202 is not deployed. 2D material layer 203 may include any 2D material suitable for use as a channel material in a FET or Fe FET. In some embodiments, 2D material layer 203 is graphene-based (or graphene family) material such as graphene, hexagonal boron nitride (hBN, white graphene), boron and nitrogen co-doped graphene (BCN), fluorographene, or graphene oxide. In some embodiments, 2D material layer 203 is a 2D chalcogenide such as a transition metal dichalcogenide (TMD), a semiconducting dichalcogenide, a metallic dichalcogenide, or a layered semiconductor. In some embodiments, 2D material layer 203 includes a transition metal and a chalcogen. For example, 2D material layer 203 may be $MoS_2$, $WS_2$, $MoSe_2$, or $WSe_2$. In some embodiments, 2D material layer 203 is a semiconducting dichalcogenide including a chalcogen and a metal. In some embodiments, the semiconducting dichalcogenide is one of the TMD materials discussed above. In some embodiments, the semiconducting dichalcogenide is one of $ZrS_2$ or $ZrSe_2$. In some embodiments, 2D material layer 203 is a 2D oxide such as a mica or bismuth strontium calcium copper oxide (BSCCO) including $MoO_3$ or $WO_3$. In some embodiments, 2D material layer 203 is a 2D oxide such as a layered copper oxide including $TiO_2$, $MnO_2$, $V_2O_5$, $TaO_3$, $RuO_2$, or the like. In some embodiments, 2D material layer 203 is a 2D oxide such as a perovskite-type including $LaNb_2O_7$, $(Ca,Sr)_2Nb_3O_{10}$, $Bi_4Ti_3O_{12}$, $Ca_2Ta_2TiO_{10}$, or the like. In some embodiments, 2D material layer 203 is a 2D oxide such as a hydroxide including $Ni(OH)_2$ or $Eu(OH)_2$ or the like.

Returning to FIG. 1, processing continues at operation 102, where a first layer is formed on or over the 2D material layer. The first layer includes a material, such as a metal, that is to be selectively oxidized to provide a gate oxide. Furthermore, the material of the first layer is selected such that it is a suitable source or drain structure material in its non-oxidized form. That is, after selective oxidization via $O_2$ plasma, ozone, water, hydrogen peroxide, or similar processing, for example, in non-oxidized regions the first layer material as deposited provides a source or drain structure and, in oxidized regions, the oxidized first layer material provides a gate dielectric structure. The first layer may be formed using any suitable technique or techniques such as blanket CVD or PVD techniques.

Processing continues at operation 103, where a second layer is formed on or over the first layer formed at operation 102. The second layer includes a material, such as a metal or metal nitride, that is to be patterned and protect portions of the first layer during the discussed oxidation processing (i.e., during $O_2$ plasma, ozone, water, etc. processing). Furthermore, the material of the second layer is selected such that it is a suitable source or drain structure material. The second layer may be formed using any suitable technique or techniques such as blanket CVD or PVD techniques.

As discussed herein, methods 100 may be advantageously deployed using Ru based material systems or metal nitride-based material systems. Ru based material systems are discussed with respect to FIGS. 2A, 2B, 2C, 2D, 2E, 2F, and 2G and FIGS. 3A, 3B, and 3C. Metal nitride-based material systems are discussed with respect to FIGS. 4A, 4B, 4C, 4D, and 4E.

In the context of Ru based material systems, the second layer formed at operation 103 is ruthenium. For example, the second layer may be substantially pure ruthenium. Notably, Ru may be advantageously etched with oxygen plasma to enable a process flow where a gate oxide is formed by plasma process after patterning the Ru layer. Such process flows offer the advantages of form source/drain and a gate oxide region in a single lithography step without exposing the 2D material to the photoresist or lithography mask. In such embodiments, the first layer is one or more of aluminum, titanium, hafnium, tantalum, niobium, tungsten, lanthanum, cerium, vanadium, yttrium, molybdenum, or silicon. In the context of oxidation thereof and deployment in source and drain contexts, silicon is characterized as a metal herein. In some embodiments, the first layer is substantially pure or pure aluminum, substantially pure or pure titanium, substantially pure or pure hafnium, substantially pure or pure tantalum, substantially pure or pure niobium, substantially pure or pure tungsten, substantially pure or pure lanthanum, substantially pure or pure cerium, substantially pure or pure vanadium, substantially pure or pure yttrium, substantially pure or pure molybdenum, or substantially pure or pure silicon.

In the context of metal nitride-based material systems, the second layer formed at operation 103 is a metal nitride such as titanium nitride, molybdenum nitride, hafnium nitride, zirconium nitride, or tantalum nitride, and the first layer formed at operation 102 is a different metal nitride such as titanium nitride or niobium nitride. For example, a process flow is provided where oxidation of TiN or NbN leads to gate oxide formation on the 2D material again in a single lithography step without exposing the 2D material to the photoresist (and any unwanted carbon interlayer between the 2D material and the gate oxide).

Figure 2B:
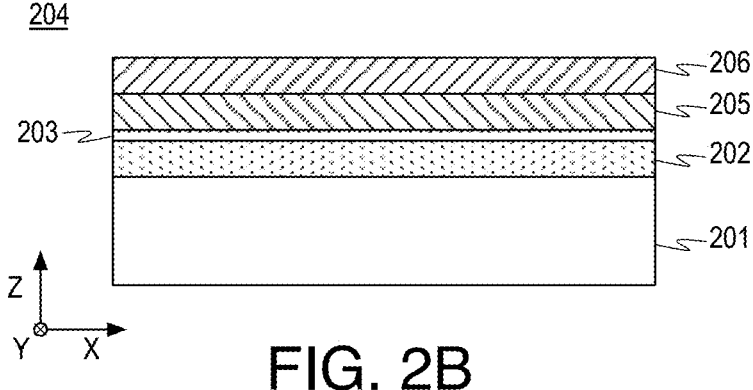

FIG. 2B illustrates a cross-sectional side view of a 2D channel material-based transistor structure 204 similar to 2D channel material-based transistor structure 200 after formation of a metal layer 205 and a ruthenium layer 206. As shown, 2D channel material-based transistor structure 204 includes metal layer 205 blanket deposited on or over 2D material layer 203 and ruthenium layer 206 blanket deposited on or over metal layer 205.

Metal layer 205 may include any suitable metal or metals as discussed with respect to operation 102 such as aluminum, titanium, hafnium, tantalum, niobium, tungsten, lanthanum, cerium, vanadium, yttrium, molybdenum, or silicon. In the context of FIG. 2B, a single metal layer is used. However, two, three, or more metal layers (i.e., each having a particular metal) may be formed, as discussed with respect to FIG. 3A herein below. Metal layer 205 may have any suitable thickness such as a thickness of about 1 nm. In some embodiments, metal layer 205 has a thickness in the range of 1 to 3 nm, in the range of 3 to 7 nm, or in the range of 4 to 6 nm.

Ruthenium layer 206 may be any purity of Ru. In some embodiments, ruthenium layer 206 is substantially pure Ru (i.e., not less than 99% Ru) or pure Ru (i.e., not less than 99.9% Ru). In some embodiments, ruthenium layer 206 is not less than 90% Ru. In some embodiments, ruthenium layer 206 is not less than 95% Ru. Ruthenium layer 206 may have any suitable thickness such as a thickness of about 25 nm. In some embodiments, ruthenium layer 206 has a thickness in the range of 20 to 40 nm, in the range of 20 to 30 nm, or in the range of 22 to 27 nm.

Returning to FIG. 1, processing continues at operation 104, where a patterned layer or mask is formed on or over the second layer formed at operation 103. The patterned layer or mask may be hard mask such as $SiO_2$, TiN, W, or a resist compatible with oxygen radicals (formed with plasma or ozone) layer. The patterned layer or mask may be formed using any suitable technique or techniques such as photolithography techniques. The patterned layer or mask provides openings to expose regions of the first layer that are to be gate dielectric material while covering regions that are to be source and drain regions of the second layer and the first layer. Furthermore, the openings of the patterned layer or mask correspond to a channel region of the transistor structure. As used herein, the term channel region indicates a region of a semiconductor layer adjacent to a gate dielectric and gate electrode that is to be controlled by the gate electrode to switch the transistor structure in operation.

Notably, a region of a semiconductor layer need not be in operation to be characterized as a channel region, channel semiconductor, or the like.

Figure 2C:
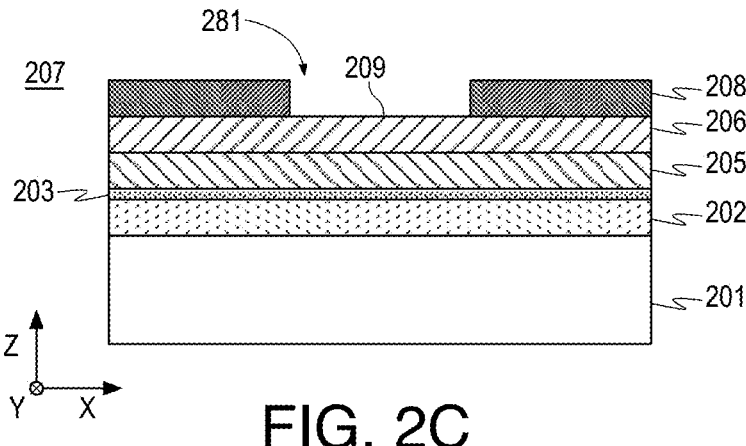

FIG. 2C illustrates a cross-sectional side view of a 2D channel material-based transistor structure 207 similar to 2D channel material-based transistor structure 204 after formation of a patterned layer 208, such as a mask layer, on or over ruthenium layer 206. As shown, patterned layer 208 includes an opening 281 to expose a portion 209 of ruthenium layer 206. For example, opening 281 may define a channel region of 2D material layer 203 and a portion of metal layer 205 to be oxidized into a gate dielectric. Other portions of patterned layer 208 may define eventual source and drain regions of a FET/FeFET.

Returning to FIG. 1, processing continues at operation 105, where exposed portions of the second layer are removed, and at operation 106, where the exposed portions of the first layer are oxidized using any suitable technique or techniques such as an oxygen plasma and/or ozone, water, hydrogen peroxide, or any oxygen radicals application. Such processing oxidizes the underlying portion of the first layer exposed by the selective removal of the second layer. In some embodiments, the selective removal and oxidation are performed in the same wet etch operation. The exposed portions of the second layer may be removed using any suitable technique or techniques. In some embodiments, the second layer is Ru and the Ru layer may be removed using an $O_2$ plasma treatment, and the same $O_2$ plasma treatment may oxidize the first layer once it is exposed such that operations 105, 106 are performed in a single process. For example, an $O_2$ plasma treatment to pattern the second layer and to oxidize the exposed first layer may be provided by continuous processing in the same process chamber (i.e., without breaking a process chamber seal). Notably, while the exposed Ru will be etched by the $O_2$ plasma treatment, the underlying metal (e.g., Al or the like) will not etch but will oxidize under the $O_2$ plasma treatment.

In other embodiments, the second layer is a metal nitride such as titanium nitride, and the metal nitride may be removed using selective etch processing (i.e., an etch selective between the second and first layers) at operation 105. A subsequent $O_2$ plasma treatment is then applied at operation 106 to oxidize the first layer after it is exposed by the etch operation.

Figure 2D:
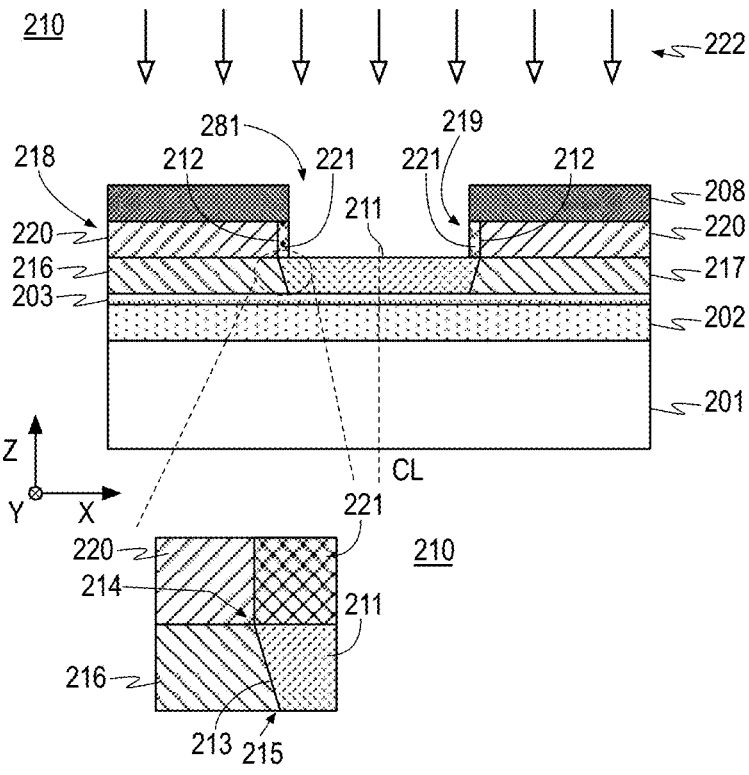

FIG. 2D illustrates a cross-sectional side view of a 2D channel material-based transistor structure 210 similar to 2D channel material-based transistor structure 207 after selective removal of ruthenium layer 206 and formation of gate dielectric structure 211. As shown, an $O_2$ plasma treatment 222 is applied such that patterned layer 208 protects source and drain regions while opening 281 exposes the underlying layers to $O_2$ plasma treatment 222. $O_2$ plasma treatment 222 etches exposed portions of ruthenium layer 206 to form a source structure 218 and a drain structure 219. Source structure 218 includes a ruthenium body 220 and a layer 221 on a sidewall 212 of ruthenium body 220 such that layer 221 includes ruthenium and oxygen. For example, $O_2$ plasma treatment 222, in addition to etching exposed portions of ruthenium layer 206, forms a ruthenium oxide layer 221 on sidewall 212 of ruthenium body 220. In a similar manner, drain structure 219 includes ruthenium body 220 and layer 221 on sidewall 212 of ruthenium body 220 such that layer 221 includes ruthenium and oxygen. Notably, formation of the gate oxide of gate dielectric structure 211 via $O_2$ plasma treatment 222 (e.g., oxygen plasma etching of Ru and oxidation of a first layer metal on a channel) introduces a partially oxidized layer 221 on sidewall 212 of ruthenium body 220 (i.e., oxidized Ru sidewalls deposited on source and drain regions).

Furthermore, $O_2$ plasma treatment 222 oxidizes the exposed portion of metal layer 205 to form gate dielectric structure 211, which includes the metal or metals of metal layer 205 and oxygen. For example, gate dielectric structure 211 may include oxygen and one or more of aluminum, titanium, hafnium, tantalum, niobium, tungsten, lanthanum, cerium, vanadium, yttrium, molybdenum, or silicon. That is, gate dielectric structure 211 may include aluminum oxide, titanium oxide, hafnium oxide, tantalum oxide, niobium oxide, tungsten oxide, lanthanum oxide, cerium oxide, vanadium oxide, yttrium oxide, molybdenum, or silicon oxide. The non-oxidized portions of metal layer 205 remain the original metal material to provide a source structure 216 and a drain structure 217.

As shown in enlarged view 210, in some embodiments, gate dielectric structure 211 has a sloped sidewall 213 in contact with source structure 216 such that sloped sidewall 213 extends from a first position 214 of sloped sidewall 213 adjacent to ruthenium body 220 to a second position 215 of sloped sidewall 213 distal from ruthenium body 220 such that second position 215 is closer to a centerline CL of 2D channel material-based transistor structure 210 than first position 214. That is, sloped sidewall 213 slopes inwardly from a top or top surface of gate dielectric structure 211 to a bottom or bottom surface of gate dielectric structure 211.

Returning to FIG. 1, processing continues at operation 107, where the patterned layer or mask is removed using any suitable technique or techniques.

Figure 2E:
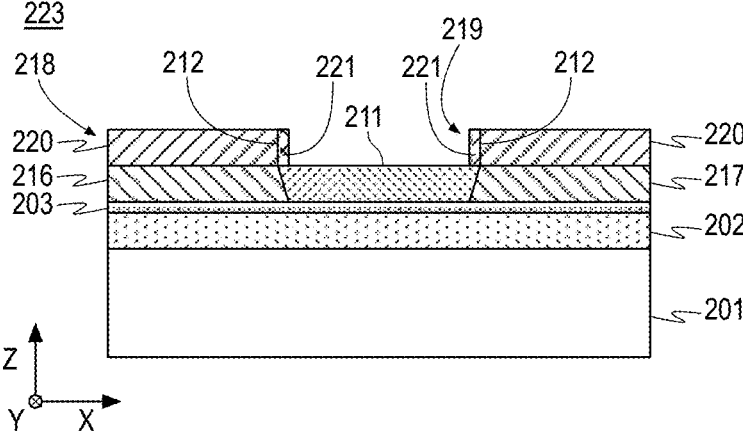

FIG. 2E illustrates a cross-sectional side view of a 2D channel material-based transistor structure 223 similar to 2D channel material-based transistor structure 210 after removal of patterned layer 208. As shown, 2D channel material-based transistor structure 223 includes 2D material layer 203 (e.g., a semiconductor layer including a 2D material), gate dielectric structure 211 on 2D material layer 203 such that the gate dielectric structure 211 includes comprising a first metal and oxygen, source and drain structures 216, 217 in contact with gate dielectric structure 211 and 2D material layer 203 such that source and drain structures 216, 217 include the first metal, and source and drain structures 218, 219 on source and drain structures 216, 217, respectively, such that include ruthenium body 220 and layer 221 including ruthenium and oxygen on sidewall 212 of ruthenium body 220 adjacent gate dielectric structure 211.

A gate electrode may then be formed on or over gate dielectric structure 211 of 2D channel material-based transistor structure 223, and the gate electrode and source and drain structures 218, 219 may be contacted by a gate contact, a source contact, and a drain contact. In some embodiments, a back gate or control gate may also be provided. In the following illustrations, a second gate dielectric structure is formed, and a back gate is employed. However, such features are optional, and, in other embodiments, the gate electrode is formed on gate dielectric structure 211 and/or no back gate is used. Other FET or FeFET architectures may be used.

Returning to FIG. 1, processing continues at operation 108, where a second gate dielectric structure may be formed, and a gate electrode is fabricated on the second gate dielectric structure, or the gate dielectric structure formed by oxidation of the first layer as discussed herein. The optional second gate dielectric structure may be formed using any suitable technique or techniques such as ALD and planarization processing.

Processing continues at operation 108, where gate, source, and drain contacts are formed, and continued processing is performed as is known in the art. Such processing may include forming interconnect features including metallization routings and vias (e.g., back-end fabrication), dicing, packaging, assembly, and so on. The resultant device (e.g., monolithic integrated circuit die) may then be implemented in any suitable form factor device such as a laptop, a netbook, a notebook, an Ultrabook, a smartphone, a tablet, a personal digital assistant, an ultra-mobile PC, a mobile phone, a desktop computer, a server, a printer, a scanner, a monitor, a set-top box, an entertainment control unit, a digital camera, a portable music player, a digital video recorder, or the like.

Figure 2F:
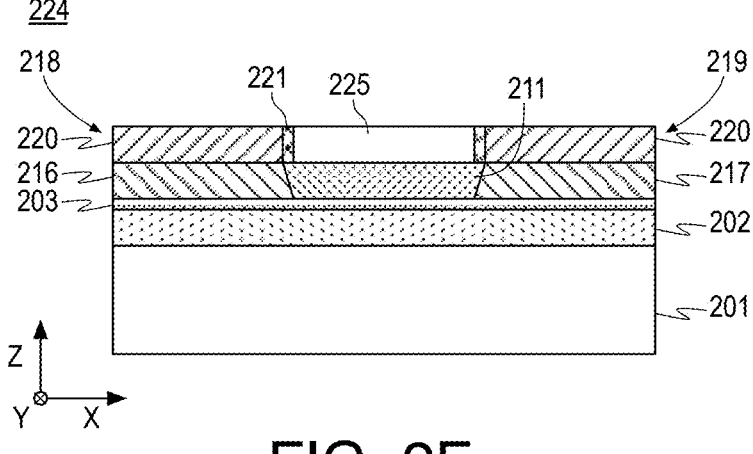

FIG. 2F illustrates a cross-sectional side view of a 2D channel material-based transistor structure 224 similar to 2D channel material-based transistor structure 223 after formation of a second gate dielectric structure 225. Second gate dielectric structure 225 may be formed using any suitable technique or techniques such as blanket deposition followed by planarization processing (e.g., chemical mechanical polish) such that a top surface of second gate dielectric structure 225 and top surfaces of source and drain structures 218, 219 are substantially coplanar. Second gate dielectric structure 225 may include any suitable dielectric material discussed with respect to the gate dielectric materials of gate dielectric or ferroelectric material layer 202. In some advantageous embodiments, second gate dielectric structure 225 is hafnium oxide (i.e., includes hafnium and oxygen) and gate dielectric structure 211 is aluminum oxide (i.e., includes aluminum and oxygen). In some embodiments, second gate dielectric structure 225 is hafnium oxide (i.e., includes hafnium and oxygen) and gate dielectric structure 211 is titanium oxide (i.e., includes titanium and oxygen), tantalum oxide (i.e., includes tantalum and oxygen), niobium oxide (i.e., includes niobium and oxygen), tungsten oxide (i.e., includes tungsten and oxygen), or silicon oxide (i.e., includes silicon and oxygen). As shown, gate dielectric structure 225 is on gate dielectric structure 211, and second gate dielectric structure 225 is laterally adjacent source and drain structures 218, 219.

Figure 2G:
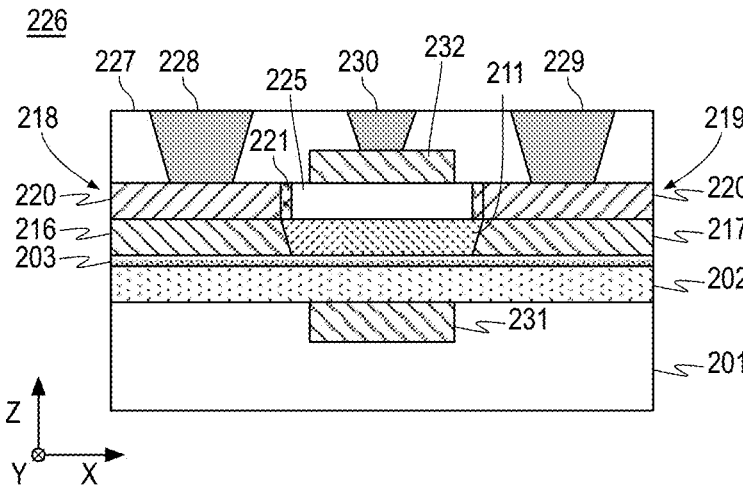

FIG. 2G illustrates a cross-sectional side view of a 2D channel material-based transistor structure 226 similar to 2D channel material-based transistor structure 224 after formation of a gate contact 230, a source contact 228, and a drain contact 229 embedded in an insulative material 227. In some embodiments, insulative material 227 is bulk deposited, planarized, and patterned to form openings. Gate contact 230, source contact 228, and drain contact 229 are then formed in the openings by, for example, one or more layers of contact metal being deposited inside each of openings and on a top surface of insulative material 227. Planarization processing may then be performed to remove the metal from the top surface of insulative material 227, leaving gate contact 230, source contact 228, and drain contact 229 within insulative material 227. Suitable contact metals include, but are not limited to, titanium, aluminum, nickel, or alloys thereof. In some embodiments, a tungsten capping or fill layer is deposited on the one or more layers of contact metal.

Also as shown, 2D channel material-based transistor structure 226 may include a second gate dielectric structure or ferroelectric structure as provided by gate dielectric or ferroelectric material layer 202 and a gate electrode 231 (i.e., a back gate). Gate dielectric or ferroelectric material layer 202 is on a bottom surface of semiconductor layer 2D material layer 203 such that the bottom surface is opposite a top surface of 2D material layer 203. As shown, gate dielectric structure 211 is on the top surface of 2D material layer 203. Furthermore, gate dielectric or ferroelectric material layer 202 is between gate electrode 231 and the bottom surface of 2D material layer 203. Gate electrode 231 (i.e., a back gate) may be formed using any suitable technique or techniques and gate electrode 231 may be a separate gate structure (as shown) such as a metal structure or the back gate may be provided as a global back gate via substrate 201.

Returning to FIG. 1, discussion now turns to use of a multilayer stack as the first layer discussed with respect to operation 102. For example, the first layer may be a layer of a single metal or a multilayer stack of differing metals. The multilayer stack may include any number of differing layers such as two layers, three layers, or more. In the context of three or more layers, each metal layer may be unique, or metal layers may be repeated. Subsequent to the formation of the multilayer stack, a ruthenium layer is formed over the top layer of the stack as discussed with respect to operation 103. Processing then continues in accordance with the discussion above such that the ruthenium layer is selectively removed by $O_2$ plasma treatment, and each layer of the multilayer stack is oxidized by the same $O_2$ plasma treatment.

FIG. 3A illustrates a cross-sectional side view of a 2D channel material-based transistor structure 300 similar to 2D channel material-based transistor structure 200 (refer to FIG. 2A) after formation of a multilayer metal stack 301 and ruthenium layer 206. Multilayer metal stack 301 may include any number of metal layers 302, 303, 304 such as two layers, three layers (as illustrated), four layers, or more. Metal layers 302, 303, 304 may include any materials discussed with respect to metal layer 205 in any combination. For example, metal layers 302, 303, 304 may be any of aluminum, titanium, hafnium, tantalum, niobium, tungsten, lanthanum, cerium, vanadium, yttrium, molybdenum, or silicon. Metal layers 302, 303, 304 may have any suitable thicknesses such as a thickness of about 5 nm or thicknesses in the range of about 1 to 5 nm. As discussed, each of the metal layers may be unique or particular metals may be repeated in the stack.

In some advantageous embodiments, a bilayer multilayer metal stack 301 is used such that metal layer 302 is aluminum and metal layer 303 is hafnium, such that metal layer 302 is aluminum and metal layer 303 is titanium, or such that metal layer 302 is silicon and metal layer 303 is hafnium. However, any combination of metals discussed herein may be used. In some bilayer metal stack embodiments, metal layer 302 is about 0.5 nm and metal layer 303 is about 2 nm. After oxidization, as discussed herein below, such layers form oxides of the discussed metals. In some embodiments, deployment of multilayer metal stack 301 may allow for formation of a ferroelectric material after oxidation. In some embodiments, a bilayer multilayer metal stack 301 is used such that metal layer 302 is hafnium and metal layer 303 is zirconium (or vice versa), such that, after oxidization, a $HfZrO_2$ material is formed.

In some advantageous embodiments, a trilayer multilayer metal stack 301 is used such that metal layer 302 is aluminum, metal layer 303 is hafnium, and metal layer 304 is titanium, such that metal layer 302 is aluminum, metal layer 303 is silicon, and metal layer 304 is titanium, or such that metal layer 302 is silicon, metal layer 303 is aluminum, and metal layer 304 is hafnium. However, any combination of metals discussed herein may be used. In some trilayer metal stack embodiments, metal layer 302 is about 0.5 nm, metal layer 303 is about 0.5 nm, and metal layer 304 is about 2 nm. Again, after oxidization, such layers form oxides of the discussed metals.

Deployment of multilayer metal stack 301 (e.g., bilayers, trilayers, or more) may offer the advantages of tuning the performance of the eventual FET/FeFET by, for example, boosting the gate dielectric constant, tuning Vt shift of the FET/FeFET, tuning the work function of the metal to have ohmic contact at the source/drain, and others.

FIG. 3B illustrates a cross-sectional side view of a 2D channel material-based transistor structure 305 similar to 2D channel material-based transistor structure 300 after formation of patterned layer 208, selective removal of ruthenium layer 206, formation of gate dielectric structure 320, and removal of patterned layer 208. For example, processing may progress from FIG. 3A to FIG. 3B as discussed with respect to FIGS. 2B to 2E.

As discussed with respect to FIG. 2D, an $O_2$ plasma treatment is applied such that the patterned layer protects source and drain regions while an opening in the patterned layer exposes the underlying layers to the $O_2$ plasma treatment. The $O_2$ plasma treatment etches exposed portions of ruthenium layer 206 to form source structure 218 and drain structure 219. Furthermore, the $O_2$ plasma treatment oxidizes multilayer metal stack 301 to form gate dielectric structure 320. The non-oxidized portions of multilayer metal stack 301 remain the original metal material layers to provide a source structure 316 and a drain structure 317.

As shown, in some embodiments, gate dielectric structure 320 and source structure 316 and drain structure 317 are each a multilayer stack. Gate dielectric structure 320 may include a gate dielectric layer 310 including the metal of metal layer 302 and oxygen, a gate dielectric layer 311 including the metal of metal layer 303 and oxygen, a gate dielectric layer 312 including the metal of metal layer 304 and oxygen, and so on, in accordance with metal layers (i.e., bilayer, trilayer, or more) of multilayer metal stack 301. Furthermore, each of source and drain structures 316, 317 include metal layers 302, 303, 304 of multilayer metal stack 301 (i.e., the bilayer, trilayer, or more of multilayer metal stack 301 unaltered).

In some embodiments, a bilayer gate dielectric structure 320 includes gate dielectric layer 310 including oxygen and aluminum (e.g., aluminum oxide) and gate dielectric layer 311 including oxygen and hafnium (e.g., hafnium oxide). In some embodiments, a bilayer gate dielectric structure 320 includes gate dielectric layer 310 including oxygen and aluminum (e.g., aluminum oxide) and gate dielectric layer 311 including oxygen and titanium (e.g., titanium oxide). In some embodiments, a bilayer gate dielectric structure 320 includes gate dielectric layer 310 including oxygen and silicon (e.g., silicon oxide) and gate dielectric layer 311 including oxygen and hafnium (e.g., hafnium oxide).

In some embodiments, a trilayer gate dielectric structure 320 includes gate dielectric layer 310 including oxygen and aluminum (e.g., aluminum oxide), gate dielectric layer 311 including oxygen and hafnium (e.g., hafnium oxide), and gate dielectric layer 312 including oxygen and titanium (e.g., titanium oxide). In some embodiments, a trilayer gate dielectric structure 320 includes gate dielectric layer 310 including oxygen and aluminum (e.g., aluminum oxide), gate dielectric layer 311 including oxygen and silicon (e.g., silicon oxide), and gate dielectric layer 312 including oxygen and titanium (e.g., titanium oxide). In some embodiments, a trilayer gate dielectric structure 320 includes gate dielectric layer 310 including oxygen and silicon (e.g., silicon oxide), gate dielectric layer 311 including oxygen and aluminum (e.g., aluminum oxide), and gate dielectric layer 312 including oxygen and hafnium (e.g., hafnium oxide).

As shown, in some embodiments, gate dielectric structure 320 and source and drain structures 316, 317 each include multilayer stacks. Gate dielectric structure 320 includes gate dielectric layer 310 including a first metal and oxygen and gate dielectric layer 311 including a second metal and oxygen. Source and drain structures 316, 317 each include a metal layer 302 including the first metal and a metal layer 303 including the second metal. Metal layer 302 is in contact with dielectric layer 310 and second metal layer 303 is in contact with gate dielectric layer 311. In some embodiments, gate dielectric structure 320 also includes gate dielectric layer 312 including a third metal and oxygen and source and drain structures 316, 317 each include a metal layer 304 including the third metal. As shown, metal layer 304 is in contact with gate dielectric layer 312.

FIG. 3C illustrates a cross-sectional side view of a 2D channel material-based transistor structure 326 similar to 2D channel material-based transistor structure 305 after formation of second gate dielectric structure 225 and formation of gate contact 230, source contact 228, and drain contact 229 in insulative material 227. For example, processing may progress from FIG. 3B to FIG. 3C as discussed with respect to FIGS. 2E to 2G. In FIG. 3C and elsewhere herein, like numerals are used to indicate like components, which may have any characteristics discussed herein. For example, the like components of 2D channel material-based transistor structure 326 with respect to 2D channel material-based transistor structure 226 may have any characteristics discussed with respect to FIGS. 2F and 2G herein above.

Returning to FIG. 1, discussion now turns to use of a nitride-based material system for the formation of 2D channel material-based transistor structures. In some embodiments, the first layer formed at operation 102 is a metal nitride such as niobium nitride (i.e., a layer including niobium and nitrogen) and the second layer formed at operation 103 is a different metal nitride such as titanium nitride (i.e., a layer including titanium and nitrogen), molybdenum nitride (i.e., a layer including molybdenum and nitrogen), hafnium nitride (i.e., a layer including hafnium and nitrogen), zirconium nitride (i.e., a layer including zirconium and nitrogen), or tantalum nitride (i.e., a layer including tantalum and nitrogen), or a metal such as aluminum or hafnium. Although discussed with respect to niobium nitride, other metal nitride first layers may be used.

Processing continues as discussed above at operation 104, where a patterned layer or mask is formed, operation 105, where the exposed portion of the second layer is removed (i.e., the pattern in the patterned layer or mask is transferred to second layer), operation 106, where the exposed portion of the first layer is oxidized via $O_2$ plasma treatment or other techniques discussed herein, and operation 107, where the patterned layer or mask is removed. Processing may then continue at operations 108, 109 as discussed above. In contrast to the discussed ruthenium-based material systems, the nitride-based systems do not pattern the second layer via $O_2$ plasma treatment. Instead, the second layer is patterned using dry or wet etch techniques. A subsequent $O_2$ plasma treatment is then applied to oxidize the first layer.

Figure 4A:
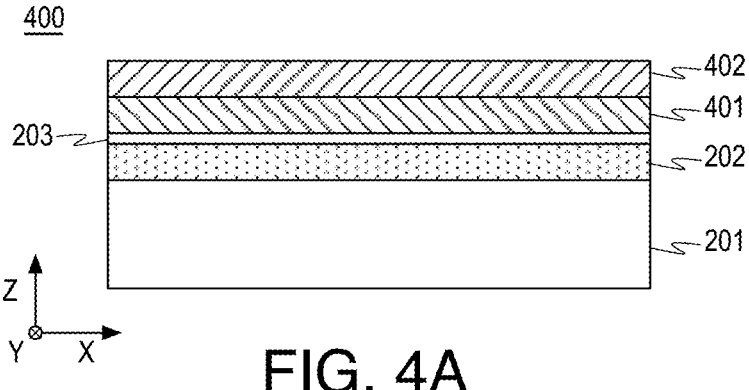
FIGS. 4A, 4B, 4C, 4D, and 4E are cross-sectional views of a 2D channel material-based transistor structure employing a metal nitride-based material system evolving as the methods of FIG. 1 are practiced.

FIG. 4A illustrates a cross-sectional side view of a 2D channel material-based transistor structure 400 similar to 2D channel material-based transistor structure 200 (refer to FIG. 2A) after formation of a metal nitride layer 401 and a metal nitride or metal layer 402. As shown, 2D channel material-based transistor structure 400 includes metal nitride layer 401 blanket deposited on or over 2D material layer 203 and metal nitride or metal layer 402 blanket deposited on or over first metal nitride layer 401.

Metal nitride layer 401 may include nitrogen and any suitable metal or metals. In some embodiments, metal nitride layer 401 includes nitrogen and niobium (i.e., niobium nitride). In some embodiments, metal nitride layer 401 includes nitrogen and one of aluminum, titanium, hafnium, tantalum, or tungsten. In the context of FIG. 4A, a single layer is used. However, two, three, or more metal layers may be formed, as discussed with respect to FIG. 3A. Metal nitride layer 401 may have any suitable thickness such as a thickness of about 5 nm, a thickness in the range of 3 to 8 nm, a thickness in the range of 3 to 7 nm, or a thickness in the range of 4 to 6 nm.

Metal nitride or metal layer 402 may include nitrogen and any suitable metal or metals or a substantially pure or pure metal. In some embodiments, metal nitride or metal layer 402 includes nitrogen and titanium (i.e., titanium nitride). In some embodiments, metal nitride layer 401 includes nitrogen and one of aluminum, hafnium, tantalum, or tungsten. In some embodiments, metal nitride or metal layer 402 is substantially pure or pure aluminum. In some embodiments, metal nitride or metal layer 402 is substantially pure or pure hafnium. Metal nitride or metal layer 402 may have any suitable thickness such as a thickness of about 5 nm, a thickness in the range of 1 to 15 nm, a thickness in the range of 8 to 12 nm, or a thickness in the range of 9 to 11 nm. Other thicknesses may be used.

Figure 4B:
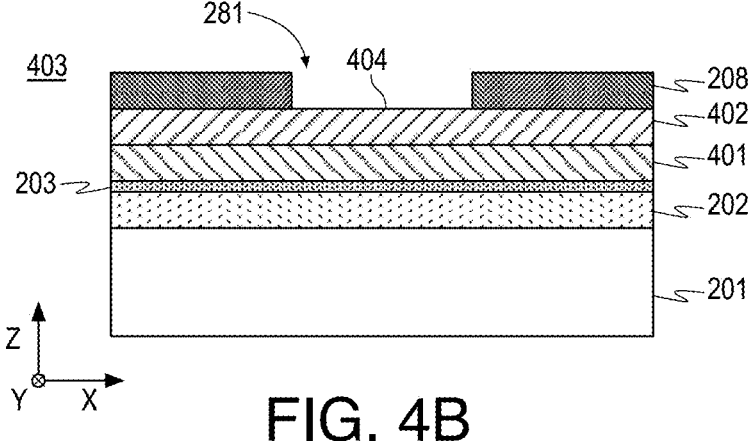

FIG. 4B illustrates a cross-sectional side view of a 2D channel material-based transistor structure 403 similar to 2D channel material-based transistor structure 400 after formation of patterned layer 208 on or over metal nitride or metal layer 402. As shown, patterned layer 208 includes opening 281 to expose a portion 404 of metal nitride or metal layer 402, and to define a channel region of 2D material layer 203 and a portion of metal nitride layer 401 to be oxidized into a gate dielectric. As discussed, other portions of patterned layer 208 may define eventual source and drain regions of a FET/FeFET.

Figure 4C:
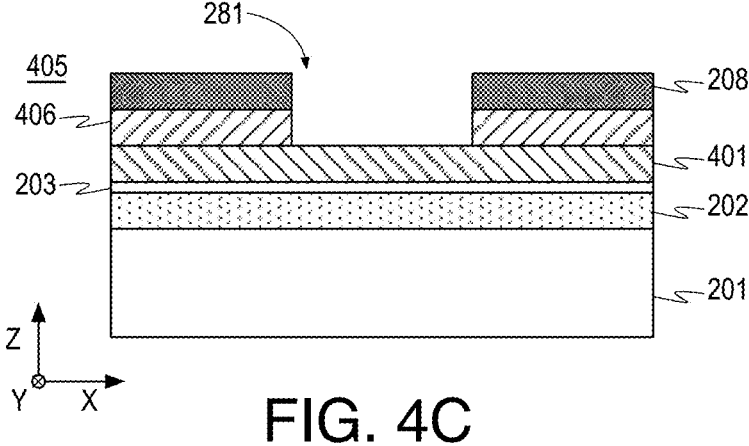

FIG. 4C illustrates a cross-sectional side view of a 2D channel material-based transistor structure 405 similar to 2D channel material-based transistor structure 403 after selective removal of a portion of metal nitride or metal layer 402 by selective etch techniques. As shown, the selective etch is applied such that patterned layer 208 protects source and drain regions while opening 281 exposes the underlying layers. The exposed portions of metal nitride or metal layer 402 are etched to form a patterned metal nitride or metal layer 406.

Figure 4D:
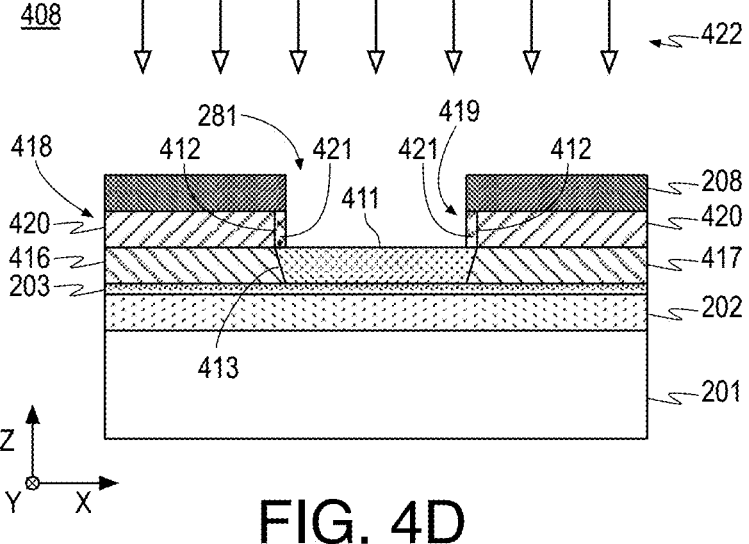

FIG. 4D illustrates a cross-sectional side view of a 2D channel material-based transistor structure 408 similar to 2D channel material-based transistor structure 405 after formation of gate dielectric structure 211 via $O_2$ plasma treatment 422. As shown, an $O_2$ plasma treatment 422 is applied such that patterned layer 208 protects source and drain regions while opening 281 exposes a portion of metal nitride layer 401 to $O_2$ plasma treatment 422. After the discussed etch processing, $O_2$ plasma treatment 422 forms gate dielectric structure 411. Furthermore, the discussed etch processing and $O_2$ plasma treatment 422 forms a source structure 418 and a drain structure 419. Source structure 418 includes a body 420 and a layer 421 on a sidewall 412 of body 420. Body 420 is the material of metal nitride or metal layer 402 (e.g., titanium nitride) and layer 421 is an oxide of that material (e.g., titanium oxynitride). In a similar manner, drain structure 419 includes body 420 and layer 421 on sidewall 412 of body 420. As discussed, formation of the gate oxide of gate dielectric structure 411 via $O_2$ plasma treatment 422 introduces a partially oxidized layer 421 on sidewall 412 of body 220.

Furthermore, $O_2$ plasma treatment 422 oxidizes the exposed portion of metal nitride layer 401 to form gate dielectric structure 411, which includes nitrogen, the metal or metals of metal nitride layer 401, and oxygen. In some embodiments, gate dielectric structure 411 includes oxygen, nitrogen, and niobium (i.e., niobium oxynitride). In some embodiments, metal nitride layer 401 includes oxygen, nitrogen, and one of aluminum, titanium, hafnium, tantalum, or tungsten. As discussed with respect to enlarged view 250 of FIG. 2D, in some embodiments, gate dielectric structure 411 has a sloped sidewall 413, which may have any characteristics as discussed with respect to sloped sidewall 213. Gate dielectric structure 411 may have any suitable thickness discussed with respect to metal nitride layer 401. The non-oxidized portions of metal nitride layer 401 remain the original metal nitride material to provide a source structure 416 and a drain structure 417.

In the context of FIG. 4A, a single layer is used; however, a multilayer stack may be used as discussed herein with respect to FIGS. 3A to 3C. In some embodiments, gate dielectric structure 411, and source structure 416 and drain structure 417 are each a multilayer stack. In some embodiments, gate dielectric structure 411 and source and drain structures 416, 417 are a multilayer stack such that gate dielectric structure 411 includes a first gate dielectric layer including a first metal, nitrogen, and oxygen and a second gate dielectric layer including a second metal, oxygen, and optionally nitrogen. In such contexts, source and drain structures 416, 417, each include a first layer including the first metal and nitrogen and a second layer including the second metal and, optionally, nitrogen. The first layer of source and drain structures 416, 417 are in contact with the first gate dielectric layer and the second layer of source and drain structures 416, 417 are in contact with the second gate dielectric layer.

In some embodiments, the first metal is niobium, and the second metal is one of aluminum or hafnium, and no nitrogen is present in the second gate dielectric layer nor the second layer of source and drain structures 416, 417. For example, metal nitride layer 401 may be a bilayer stack with a niobium nitride layer on 2D material layer 203, a layer of one of aluminum or hafnium on the niobium nitride layer, and metal nitride or metal layer 402 may be a titanium nitride layer. After selective oxidation, gate dielectric structure 411 would then include a first layer of niobium oxynitride and a second layer of aluminum oxide or hafnium oxide on the first layer of niobium oxynitride. While use of aluminum oxide or hafnium oxide may be advantageous, in some embodiments, the layer on the layer of niobium oxynitride may be one of aluminum oxide, tantalum oxide, tungsten oxide, or silicon oxide.

Figure 4E:
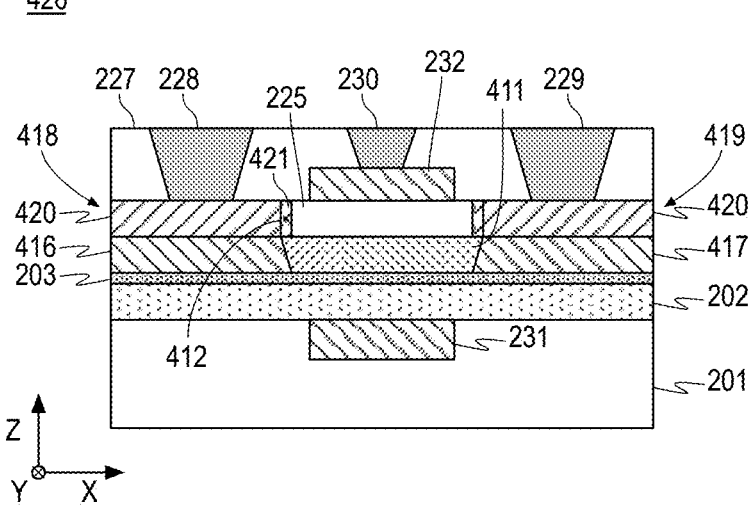

FIG. 4E illustrates a cross-sectional side view of a 2D channel material-based transistor structure 426 similar to 2D channel material-based transistor structure 408 after removal of patterned layer 208, formation of optional second gate dielectric structure 225, and formation of a gate contact 230, a source contact 228, and a drain contact 229 in an insulative material 227. For example, processing may progress from FIG. 4D to FIG. 4E as discussed with respect to FIGS. 2D to 2G.

As shown, 2D channel material-based transistor structure 426 includes 2D material layer 203 (e.g., a semiconductor layer including a 2D material), gate dielectric structure 411 on 2D material layer 203 such that gate dielectric structure 411 includes a first metal, nitrogen, and oxygen. For example, gate dielectric structure 411 may be niobium oxynitride (i.e., include niobium, nitrogen, and oxygen). 2D channel material-based transistor structure 426 further includes source and drain structures 416, 417 in contact with gate dielectric structure 411 and on 2D material layer 203 such that source and drain structures 416, 417 include the first metal and nitrogen. For example, source and drain structures 416, 417 may be niobium nitride (i.e., include niobium and nitrogen). 2D channel material-based transistor structure 426 also includes source and drain structures 418, 419 on source and drain structures 416, 417, respectively, such that each of source and drain structures 418, 419 includes body 420 including a second metal and layer 421 on sidewall 412 of body 420, such that layer 421 includes the second metal and oxygen. For example, body 420 may be titanium nitride (i.e., include titanium and nitrogen) and layer 421 may be titanium oxynitride (i.e., include titanium, oxygen, and nitrogen). 2D channel material-based transistor structure 426 includes gate electrode 232 such that gate dielectric structure 411 is between gate electrode 232 and 2D material layer 203.

Also as shown, 2D channel material-based transistor structure 426 may include second gate dielectric structure 225 on gate dielectric structure 411 such that second gate dielectric structure 225 is laterally adjacent source and drain structures 418, 419. Also as shown, 2D channel material-based transistor structure 426 may include a second gate dielectric structure or ferroelectric structure as provided by gate dielectric or ferroelectric material layer 202 and a gate electrode 231 (i.e., a back gate), as discussed herein.

Figure 5:
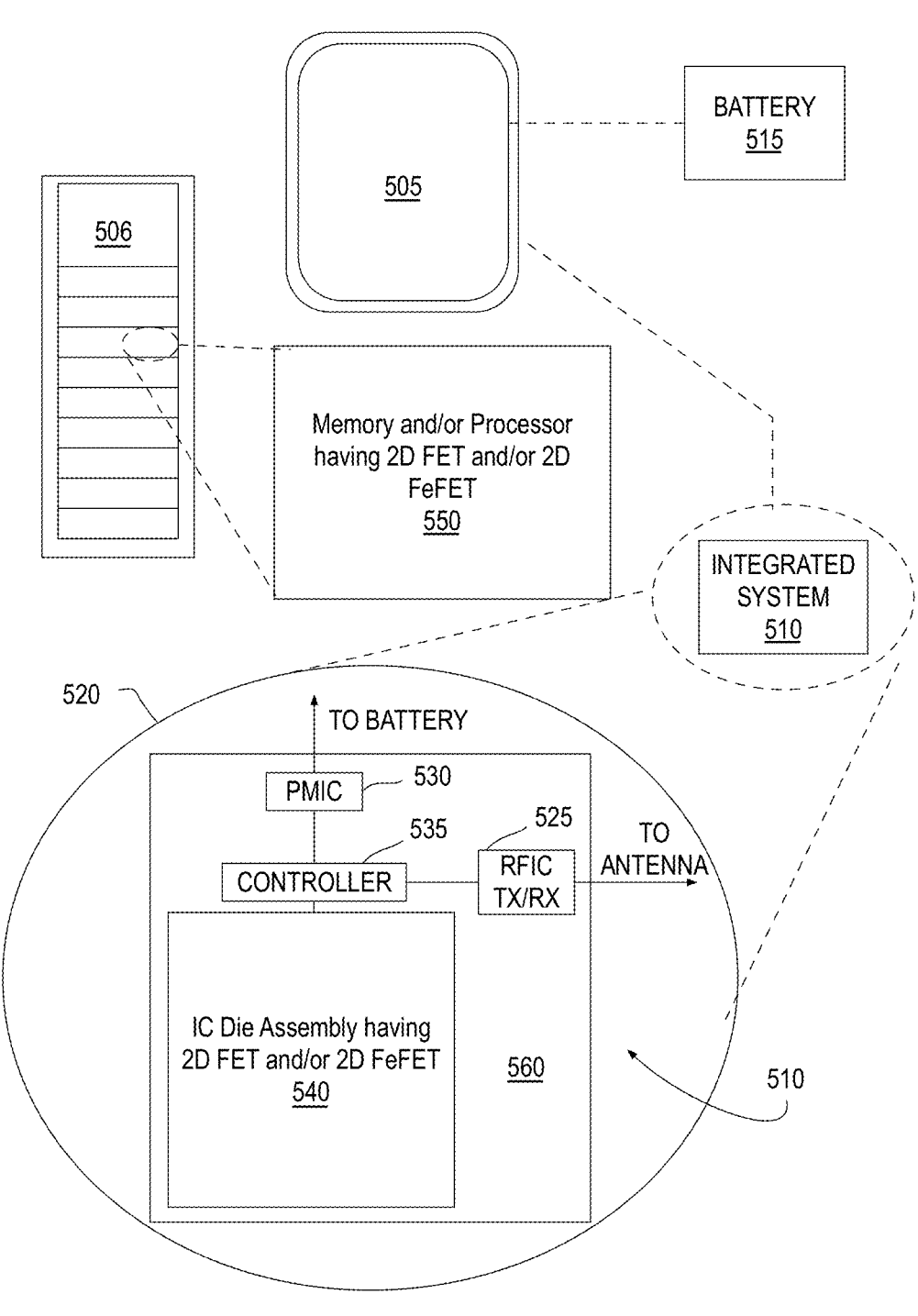
FIG. 5 illustrates exemplary systems employing a 2D channel material-based transistor having a gate dielectric formed by selective oxidation of a metal layer.

FIG. 5 illustrates exemplary systems employing a 2D channel material-based transistor having a gate dielectric formed by selective oxidation of a metal layer, in accordance with some embodiments. The system may be a mobile computing platform 505 and/or a data server machine 506, for example. Either may employ a monolithic IC die, for example, having a FET or FeFET including any 2D channel material-based transistor structure as described elsewhere herein. Server machine 506 may be any commercial server, for example including any number of high-performance computing platforms disposed within a rack and networked together for electronic data processing, which in the exemplary embodiment includes an IC die assembly 550 with a FET or FeFET including any 2D channel material-based transistor structure as described elsewhere herein. Mobile computing platform 505 may be any portable device configured for each of electronic data display, electronic data processing, wireless electronic data transmission, or the like. For example, mobile computing platform 505 may be any of a tablet, a smart phone, a laptop computer, etc., and may include a display screen (e.g., a capacitive, inductive, resistive, or optical touchscreen), a chip-level or package-level integrated system 510, and a battery 515. Although illustrated with respect to mobile computing platform 505, in other examples, chip-level or package-level integrated system 510 and a battery 515 may be implemented in a desktop computing platform, an automotive computing platform, an internet of things platform, or the like. As discussed below, in some examples, the disclosed systems may include a sub-system 560 such as a system on a chip (SOC) or an integrated system of multiple ICs, which is illustrated with respect to mobile computing platform 505.

Whether disposed within integrated system 510 illustrated in expanded view 520 or as a stand-alone packaged device within data server machine 506, sub-system 560 may include memory circuitry and/or processor circuitry 540 (e.g., RAM, a microprocessor, a multi-core microprocessor, graphics processor, etc.), a power management integrated circuit (PMIC) 530, a controller 535, and a radio frequency integrated circuit (RFIC) 525 (e.g., including a wideband RF transmitter and/or receiver (TX/RX)). As shown, one or more IC dice, such as memory circuitry and/or processor circuitry 540 may be assembled and implemented such that one or more have a FET or FeFET including any 2D channel material-based transistor structure as described elsewhere herein. In some embodiments, RFIC 525 includes a digital baseband and an analog front end module further comprising a power amplifier on a transmit path and a low noise amplifier on a receive path). Functionally, PMIC 530 may perform battery power regulation, DC-to-DC conversion, etc., and so has an input coupled to battery 515, and an output providing a current supply to other functional modules. As further illustrated in FIG. 5, in the exemplary embodiment, RFIC 525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Memory circuitry and/or processor circuitry 540 may provide memory functionality for sub-system 560, high level control, data processing and the like for sub-system 560. In alternative implementations, each of the SOC modules may be integrated onto separate ICs coupled to a package substrate, interposer, or board.

Figure 6:
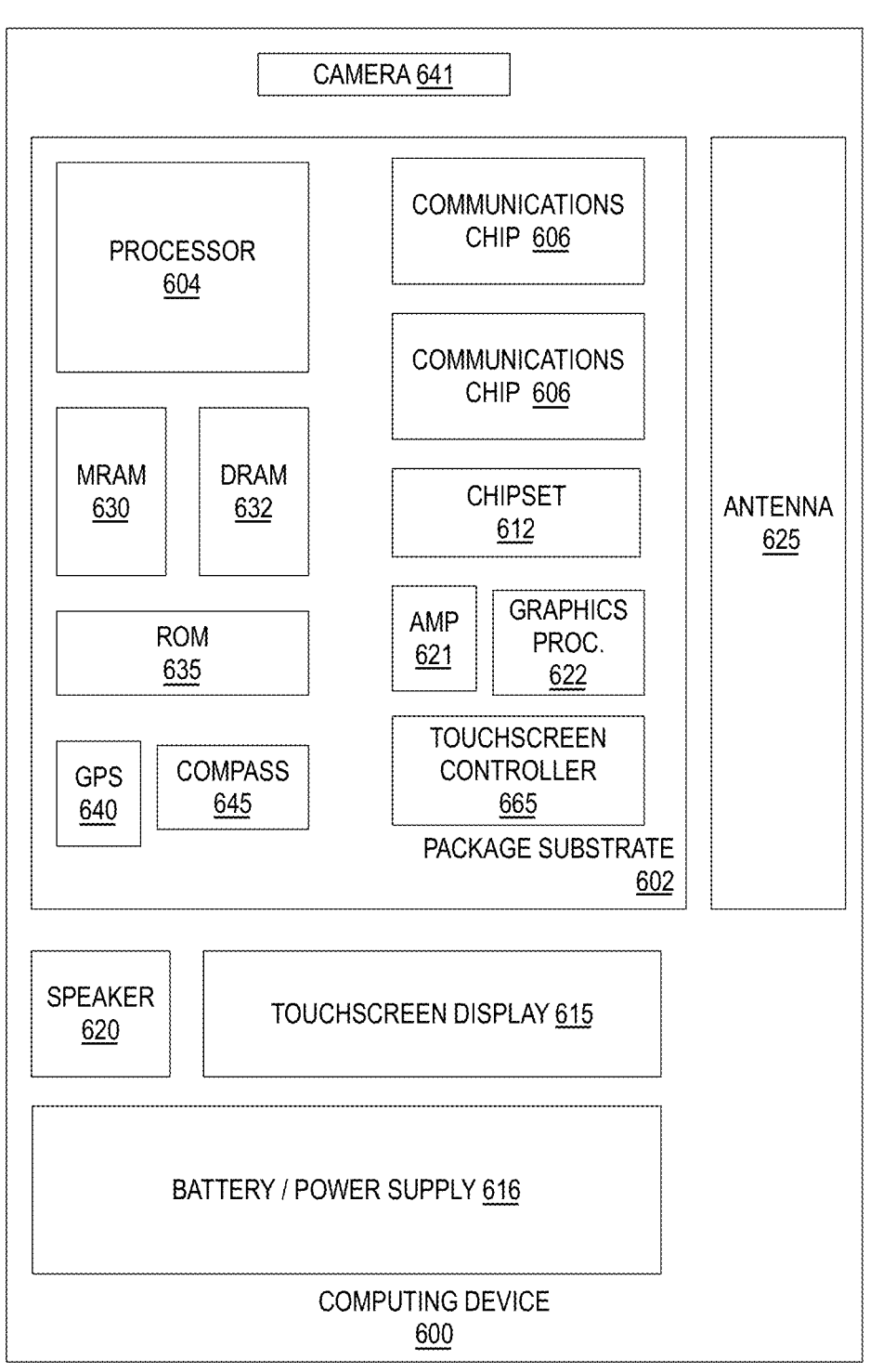
FIG. 6 is a functional block diagram of an electronic computing device, all in accordance with some embodiments.

FIG. 6 is a functional block diagram of an electronic computing device 600, in accordance with some embodiments. For example, device 600 may, via any suitable component therein, implement a FET or FeFET including any 2D channel material-based transistor structure as described elsewhere herein. For example, one or more IC dies of electronic computing device 600 may deploy a FET or FeFET including any 2D channel material-based transistor structure as described elsewhere herein. Device 600 further includes a motherboard or package substrate 602 hosting a number of components, such as, but not limited to, a processor 604 (e.g., an applications processor). Processor 604 may be physically and/or electrically coupled to package substrate 602. In some examples, processor 604 is within an IC assembly. In general, the term "processor" or "microprocessor" may refer to any device or portion of a device that processes electronic data from registers and/or memory to transform that electronic data into other electronic data that may be further stored in registers and/or memory.

In various examples, one or more communication chips 606 may also be physically and/or electrically coupled to the package substrate 602. In further implementations, communication chips 606 may be part of processor 604. Depending on its applications, computing device 600 may include other components that may or may not be physically and electrically coupled to package substrate 602. These other components include, but are not limited to, volatile memory (e.g., DRAM 632), non-volatile memory (e.g., ROM 635), flash memory (e.g., NAND or NOR), magnetic memory (MRAM 630), a graphics processor 622, a digital signal processor, a crypto processor, a chipset 612, an antenna 625, touchscreen display 615, touchscreen controller 665, battery/power supply 616, audio codec, video codec, power amplifier 621, global positioning system (GPS) device 640, compass 645, accelerometer, gyroscope, speaker 620, camera 641, and mass storage device (such as hard disk drive, solid-state drive (SSD), compact disk (CD), digital versatile disk (DVD), and so forth, or the like.

Communication chips 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 606 may implement any of a number of wireless standards or protocols, including, but not limited to, those described elsewhere herein. As discussed, computing device 600 may include a plurality of communication chips 606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others. Battery/power supply 616 may include any suitable power supply circuitry and, optionally, a battery source to provide power to components of electronic computing device 600.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described but can be practiced with modification and alteration without departing from the scope of the appended claims. For example, the above embodiments may include specific combinations of features as further provided below.

The following pertains to exemplary embodiments.

In one or more first embodiments, a transistor structure comprises a semiconductor layer comprising a 2D material, a gate dielectric structure on the semiconductor layer, the gate dielectric structure comprising a first metal and oxygen, a first source or drain structure in contact with the gate dielectric structure and on the semiconductor layer, the first source or drain structure comprising the first metal, a second source or drain structure on the first source or drain structure, the second source or drain structure comprising a substantially pure ruthenium body and a layer on a sidewall of the ruthenium body adjacent the gate dielectric structure, the layer comprising ruthenium and oxygen, and a gate electrode, such that the gate dielectric structure is between the gate electrode and the semiconductor layer.

In one or more second embodiments, further to the first embodiments, the gate dielectric structure comprises a sloped sidewall in contact with the first source or drain structure, the sloped sidewall extending from a first position of the sloped sidewall adjacent to the ruthenium body to a second position of the sloped sidewall distal from the ruthenium body, the second position closer to a centerline of the transistor structure than the first position.

In one or more third embodiments, further to the first or second embodiments, the gate dielectric structure and the first source or drain structure each comprise multilayer stacks, the gate dielectric structure comprising a first gate dielectric layer comprising the first metal and oxygen and a second gate dielectric layer comprising a second metal and oxygen, and the first source or drain structure comprising a first metal layer comprising the first metal and a second metal layer comprising the second metal, the first metal layer in contact with the first gate dielectric layer and the second metal layer in contact with the second gate dielectric layer.

In one or more fourth embodiments, further to the first through third embodiments, the gate dielectric structure comprises a third gate dielectric layer comprising a third metal and oxygen, and the first source or drain structure comprises a third metal layer comprising the third metal, the third metal layer in contact with the third gate dielectric layer.

In one or more fifth embodiments, further to the first through fourth embodiments, the first metal comprises one of aluminum, titanium, hafnium, tantalum, niobium, tungsten, lanthanum, cerium, vanadium, yttrium, molybdenum, or silicon.

In one or more sixth embodiments, further to the first through fifth embodiments, the transistor structure further comprises a second gate dielectric structure on the gate dielectric structure, such that the second gate dielectric structure is laterally adjacent the second source or drain structure.

In one or more seventh embodiments, further to the first through sixth embodiments, the gate dielectric structure is on a first surface of the semiconductor layer, and the transistor structure further comprises a second gate dielectric structure or a ferroelectric structure on a second surface of the semiconductor layer opposite the first surface, and a second gate electrode, such that the second gate dielectric structure or the ferroelectric structure is between the second gate electrode and the second surface of the semiconductor layer.

In one or more eighth embodiments, further to the first through seventh embodiments, the 2D material comprises one of graphene, a 2D chalcogenide comprising a transition metal and a chalcogen, or a 2D oxide.

In one or more ninth embodiments, a transistor structure comprises a semiconductor layer comprising a 2D material, a gate dielectric structure on the semiconductor layer, the gate dielectric structure comprising a first metal, nitrogen, and oxygen, a first source or drain structure in contact with the gate dielectric structure and on the semiconductor layer, the first source or drain structure comprising the first metal and nitrogen, a second source or drain structure on the first source or drain structure, the second source or drain structure comprising a body comprising a second metal and a layer on a sidewall of the body adjacent the gate dielectric structure, the layer comprising the second metal and oxygen, and a gate electrode, such that the gate dielectric structure is between the gate electrode and the semiconductor layer.

In one or more tenth embodiments, further to the ninth embodiments, the gate dielectric structure comprises a sloped sidewall in contact with the first source or drain structure, the sloped sidewall extending from a first position of the sloped sidewall adjacent to the body to a second position of the sloped sidewall distal from the body, the second position closer to a centerline of the transistor structure than the first position.

In one or more eleventh embodiments, further to the ninth or tenth embodiments, the first metal comprises niobium, the second metal comprises titanium, molybdenum, hafnium, zirconium, or tantalum, and the body and the layer further comprise nitrogen.

In one or more twelfth embodiments, further to the ninth through eleventh embodiments, the gate dielectric structure and the first source or drain structure each comprise multi-layer stacks, the gate dielectric structure comprising a first gate dielectric layer comprising the first metal, nitrogen, and oxygen and a second gate dielectric layer comprising a third metal and oxygen, and the first source or drain structure comprising a first metal layer comprising the first metal and nitrogen, and a second metal layer comprising the third metal, the first metal layer in contact with the first gate dielectric layer and the second metal layer in contact with the second gate dielectric layer.

In one or more thirteenth embodiments, further to the ninth through twelfth embodiments, the first metal comprises niobium, the second metal comprises titanium, and the third metal comprises one of aluminum or hafnium.

In one or more fourteenth embodiments, further to the ninth through thirteenth embodiments, the transistor structure further comprises a second gate dielectric structure on the gate dielectric structure, such that the second gate dielectric structure is laterally adjacent the second source or drain structure.

In one or more fifteenth embodiments, further to the ninth through fourteenth embodiments, the 2D material comprises one of graphene, a 2D chalcogenide comprising a transition metal and a chalcogen, or a 2D oxide.

In one or more sixteenth embodiments, a system comprises an IC die including a transistor structure according to any of the first through fifteenth embodiments, and a power supply coupled to the IC die.

In one or more seventeenth embodiments, a method comprises forming a first layer on a semiconductor layer, the semiconductor layer comprising a 2D material and the first layer comprising a first metal, forming a second layer over the first layer, the second layer comprising a second metal, forming a patterned layer over the second layer, removing a portion of the second layer within an opening of the patterned layer to expose a portion of the first layer, oxidizing the exposed portion of the first layer to form a gate dielectric structure comprising the first metal and oxygen, and removing the patterned layer.

In one or more eighteenth embodiments, further to the seventeenth embodiments, said removing the portion of the second layer and said oxidizing the exposed portion of the first layer comprises applying an oxygen plasma to remove the portion of the second layer and oxidize first metal layer.

In one or more nineteenth embodiments, further to the seventeenth or eighteenth embodiments, said removing the portion of the second layer comprises a selective etch operation.

In one or more twentieth embodiments, further to the seventeenth through nineteenth embodiments, said oxidizing the exposed portion of the first layer comprises oxidizing by wet etch treatment, ozone treatment, water treatment, or hydrogen peroxide treatment.

In one or more twenty-first embodiments, further to the seventeenth through twentieth embodiments, the second layer comprises substantially pure ruthenium, and the first metal comprises one of aluminum, titanium, hafnium, tantalum, niobium, tungsten, lanthanum, cerium, vanadium, yttrium, molybdenum, or silicon.

In one or more twenty-second embodiments, further to the seventeenth through twenty-first embodiments, the second metal comprises titanium, molybdenum, hafnium, zirconium, or tantalum, the second layer further comprises nitrogen, the first metal comprises niobium, and the first layer further comprises nitrogen.

In one or more twenty-third embodiments, further to the seventeenth through twenty-second embodiments, the first metal comprises niobium and the first layer further comprises nitrogen.

It will be recognized that the invention is not limited to the embodiments so described but can be practiced with modification and alteration without departing from the scope of the appended claims. For example, the above embodiments may include specific combination of features. However, the above embodiments are not limited in this regard, and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor structure, comprising:
a semiconductor layer comprising a 2D material;
a gate dielectric structure on the semiconductor layer, the gate dielectric structure comprising a first metal and oxygen;
a first source or drain structure in contact with the gate dielectric structure and on the semiconductor layer, the first source or drain structure comprising the first metal;
a second source or drain structure on the first source or drain structure, the second source or drain structure comprising a substantially pure ruthenium body and a layer on a sidewall of the ruthenium body adjacent the gate dielectric structure, the layer comprising ruthenium and oxygen; and
a gate electrode, wherein the gate dielectric structure is between the gate electrode and the semiconductor layer.

2. The transistor structure of claim 1, wherein the gate dielectric structure comprises a sloped sidewall in contact with the first source or drain structure, the sloped sidewall extending from a first position of the sloped sidewall adjacent to the ruthenium body to a second position of the sloped sidewall distal from the ruthenium body, the second position closer to a centerline of the transistor structure than the first position.

3. The transistor structure of claim 1, wherein the gate dielectric structure and the first source or drain structure each comprise multilayer stacks, the gate dielectric structure comprising a first gate dielectric layer comprising the first metal and oxygen and a second gate dielectric layer comprising a second metal and oxygen, and the first source or drain structure comprising a first metal layer comprising the first metal and a second metal layer comprising the second metal, the first metal layer in contact with the first gate dielectric layer and the second metal layer in contact with the second gate dielectric layer.

4. The transistor structure of claim 3, wherein the gate dielectric structure comprises a third gate dielectric layer comprising a third metal and oxygen, and the first source or drain structure comprises a third metal layer comprising the third metal, the third metal layer in contact with the third gate dielectric layer.

5. The transistor structure of claim 1, wherein the first metal comprises one of aluminum, titanium, hafnium, tantalum, niobium, tungsten, lanthanum, cerium, vanadium, yttrium, molybdenum, or silicon.

6. The transistor structure of claim 1, further comprising:
a second gate dielectric structure on the gate dielectric structure, wherein the second gate dielectric structure is laterally adjacent the second source or drain structure.

7. The transistor structure of claim 1, wherein the gate dielectric structure is on a first surface of the semiconductor layer, the transistor structure further comprising:
a second gate dielectric structure or a ferroelectric structure on a second surface of the semiconductor layer opposite the first surface; and
a second gate electrode, wherein the second gate dielectric structure or the ferroelectric structure is between the second gate electrode and the second surface of the semiconductor layer.

8. The transistor structure of claim 1, wherein the 2D material comprises one of graphene, a 2D chalcogenide comprising a transition metal and a chalcogen, or a 2D oxide.

9. The transistor structure of claim 1, wherein the 2D material comprises one of graphene, a 2D chalcogenide comprising a transition metal and a chalcogen, or a 2D oxide.

10. A transistor structure, comprising:
a semiconductor layer comprising a 2D material;
a gate dielectric structure on the semiconductor layer, the gate dielectric structure comprising a first metal, nitrogen, and oxygen;
a first source or drain structure in contact with the gate dielectric structure and on the semiconductor layer, the first source or drain structure comprising the first metal and nitrogen;
a second source or drain structure on the first source or drain structure, the second source or drain structure comprising a body comprising a second metal and a layer on a sidewall of the body adjacent the gate dielectric structure, the layer comprising the second metal and oxygen; and
a gate electrode, wherein the gate dielectric structure is between the gate electrode and the semiconductor layer.

11. The transistor structure of claim 10, wherein the gate dielectric structure comprises a sloped sidewall in contact with the first source or drain structure, the sloped sidewall extending from a first position of the sloped sidewall adjacent to the body to a second position of the sloped sidewall distal from the body, the second position closer to a centerline of the transistor structure than the first position.

12. The transistor structure of claim 10, wherein the first metal comprises niobium, the second metal comprises titanium, molybdenum, hafnium, zirconium, or tantalum, and the body and the layer further comprise nitrogen.

13. The transistor structure of claim 10, wherein the gate dielectric structure and the first source or drain structure each comprise multilayer stacks, the gate dielectric structure comprising a first gate dielectric layer comprising the first metal, nitrogen, and oxygen and a second gate dielectric layer comprising a third metal and oxygen, and the first source or drain structure comprising a first metal layer comprising the first metal and nitrogen, and a second metal layer comprising the third metal, the first metal layer in contact with the first gate dielectric layer and the second metal layer in contact with the second gate dielectric layer.

14. The transistor structure of claim 13, wherein the first metal comprises niobium, the second metal comprises titanium, and the third metal comprises one of aluminum or hafnium.

15. The transistor structure of claim 10, further comprising:

a second gate dielectric structure on the gate dielectric structure, wherein the second gate dielectric structure is laterally adjacent the second source or drain structure.

16. A method, comprising:

forming a first layer on a semiconductor layer, the semiconductor layer comprising a 2D material and the first layer comprising a first metal;

forming a second layer over the first layer, the second layer comprising a second metal;

forming a patterned layer over the second layer;

removing a portion of the second layer within an opening of the patterned layer to expose a portion of the first layer;

oxidizing the exposed portion of the first layer to form a gate dielectric structure comprising the first metal and oxygen; and removing the patterned layer.

17. The method of claim 16, wherein said removing the portion of the second layer and said oxidizing the exposed portion of the first layer comprises applying an oxygen plasma to remove the portion of the second layer and oxidize first metal layer.

18. The method of claim 16, wherein said removing the portion of the second layer comprises a selective etch operation.

19. The method of claim 16, wherein said oxidizing the exposed portion of the first layer comprises oxidizing by wet etch treatment, ozone treatment, water treatment, or hydrogen peroxide treatment.

20. The method of claim 16, wherein the second layer comprises substantially pure ruthenium, and wherein the first metal comprises one of aluminum, titanium, hafnium, tantalum, niobium, tungsten, lanthanum, cerium, vanadium, yttrium, molybdenum, or silicon.

21. The method of claim 16, wherein the second metal comprises titanium, molybdenum, hafnium, zirconium, or tantalum, the second layer further comprises nitrogen, the first metal comprises niobium, and the first layer further comprises nitrogen.

\* \* \* \* \*